US012609681B2

(12) United States Patent　　(10) Patent No.:　US 12,609,681 B2

Ogura　　(45) Date of Patent:　Apr. 21, 2026

(54) INPUT CIRCUIT AND SEMICONDUCTOR DEVICE

(71) Applicants:Kabushiki Kaisha Toshiba, Tokyo (JP); Toshiba Electronic Devices & Storage Corporation, Tokyo (JP)

(72) Inventor: Akio Ogura, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 56 days.

(21) Appl. No.: 18/818,405

(22) Filed: Aug. 28, 2024

(65) Prior Publication Data

US 2025/0300638 A1　　Sep. 25, 2025

(30) Foreign Application Priority Data

Mar. 19, 2024　(JP) ................................. 2024-044210

(51) Int. Cl.
H03K 3/356　　(2006.01)
H03K 3/313　　(2006.01)

(52) U.S. Cl.
CPC ....... H03K 3/356034 (2013.01); H03K 3/313 (2013.01)

(58) Field of Classification Search
CPC ......................... H03K 3/356034; H03K 3/313
See application file for complete search history.

(56) References Cited

U.S. PATENT DOCUMENTS

| | | | |
|---|---|---|---|
| 7,142,042 B1 * | 11/2006 | Henry ..................... | G05F 1/575 |
| | | | 327/540 |
| 8,525,555 B2 | 9/2013 | Kondo et al. | |
| 2007/0139083 A1 | 6/2007 | Mirea et al. | |
| 2011/0057190 A1 | 3/2011 | Kimura et al. | |
| 2020/0244238 A1 | 7/2020 | Morikawa | |
| 2021/0028194 A1 | 1/2021 | Kimura et al. | |

FOREIGN PATENT DOCUMENTS

| | | |
|---|---|---|
| JP | H04-063014 A | 2/1992 |
| JP | 2007-173823 A | 7/2007 |
| JP | 2011-259250 A | 12/2011 |
| JP | 2023-022087 A | 2/2023 |
| JP | 7301544 B2 | 7/2023 |

* cited by examiner

*Primary Examiner* — Lincoln D Donovan
*Assistant Examiner* — Amit R Bhatia
(74) *Attorney, Agent, or Firm* — Kim & Stewart LLP

(57) ABSTRACT

According to one embodiment, an input circuit is provided that inputs a voltage to each of drive terminals of a pair of differential transistors constituting a differential pair. The input circuit includes: a first input wiring section to which a first voltage is applied; a second input wiring section to which a second voltage; a first output wiring section to which a voltage is output to one of the pair of differential transistors; a second output wiring section to which a voltage is output to the other of the pair of differential transistors; a voltage generation circuit section that generates a third voltage based on at least one of the first voltage and the second voltage; a first transistor disposed between the first input wiring section and the first output wiring section; and a second transistor disposed between the second input wiring section and the second output wiring section.

9 Claims, 7 Drawing Sheets

FIG. 4

V1>V2, VDD−V2≧Vth

V1>V2, VDD−V1<Vth, VDD−V2<Vth

INPUT CIRCUIT AND SEMICONDUCTOR DEVICE

CROSS-REFERENCE TO RELATED APPLICATION(S)

This application claims priority to Japanese Patent Application No. 2024-044210 filed on Mar. 19, 2024, the contents of which are incorporated herein by reference.

FIELD

Embodiments of the present invention relate to an input circuit and a semiconductor device.

BACKGROUND

Differential circuits having a pair of differential transistors forming a differential pair are known. In such differential circuits, different voltages are applied to the drive terminals of the pair of differential transistors. If the difference between the voltages applied to the drive terminals of the pair of differential transistors remains large, the differential transistor to which the larger voltage is applied deteriorates, causing a phenomenon called BTI (Bias Temperature Instability), in which the threshold voltage of the differential transistor fluctuates.

To address this problem, there is a technology that uses, for example, a diode to suppress the increase in the voltage difference applied to the drive terminals of the pair of differential transistors. However, this technique has the problem that a relatively large current tends to flow between the input terminals via the diode.

BRIEF DESCRIPTION OF THE DRAWINGS

FIG. 4 is a circuit diagram showing an example of the operation of a semiconductor device of an embodiment.

DETAILED DESCRIPTION

According to an aspect, an input circuit inputs a voltage to each of drive terminals of a pair of differential transistors constituting a differential pair. The input circuit includes: a first input wiring section to which a first voltage is applied; a second input wiring section to which a second voltage different from the first voltage is applied; a first output wiring section to which a voltage is output to one of the pair of differential transistors; a second output wiring section to which a voltage is output to the other of the pair of differential transistors; a voltage generation circuit section that generates a third voltage based on at least one of the first voltage and the second voltage; a first transistor disposed between the first input wiring section and the first output wiring section; and a second transistor disposed between the second input wiring section and the second output wiring section. The third voltage is applied to the drive terminal of the first transistor and the drive terminal of the second transistor. When a difference between the first voltage and the second voltage is greater than a first predetermined value, a difference between the third voltage and a lower of the first voltage and the second voltage is less than a difference between the first voltage and the second voltage.

The input circuit and the semiconductor device of the embodiment will be described below with reference to the drawings.

Figure 1:
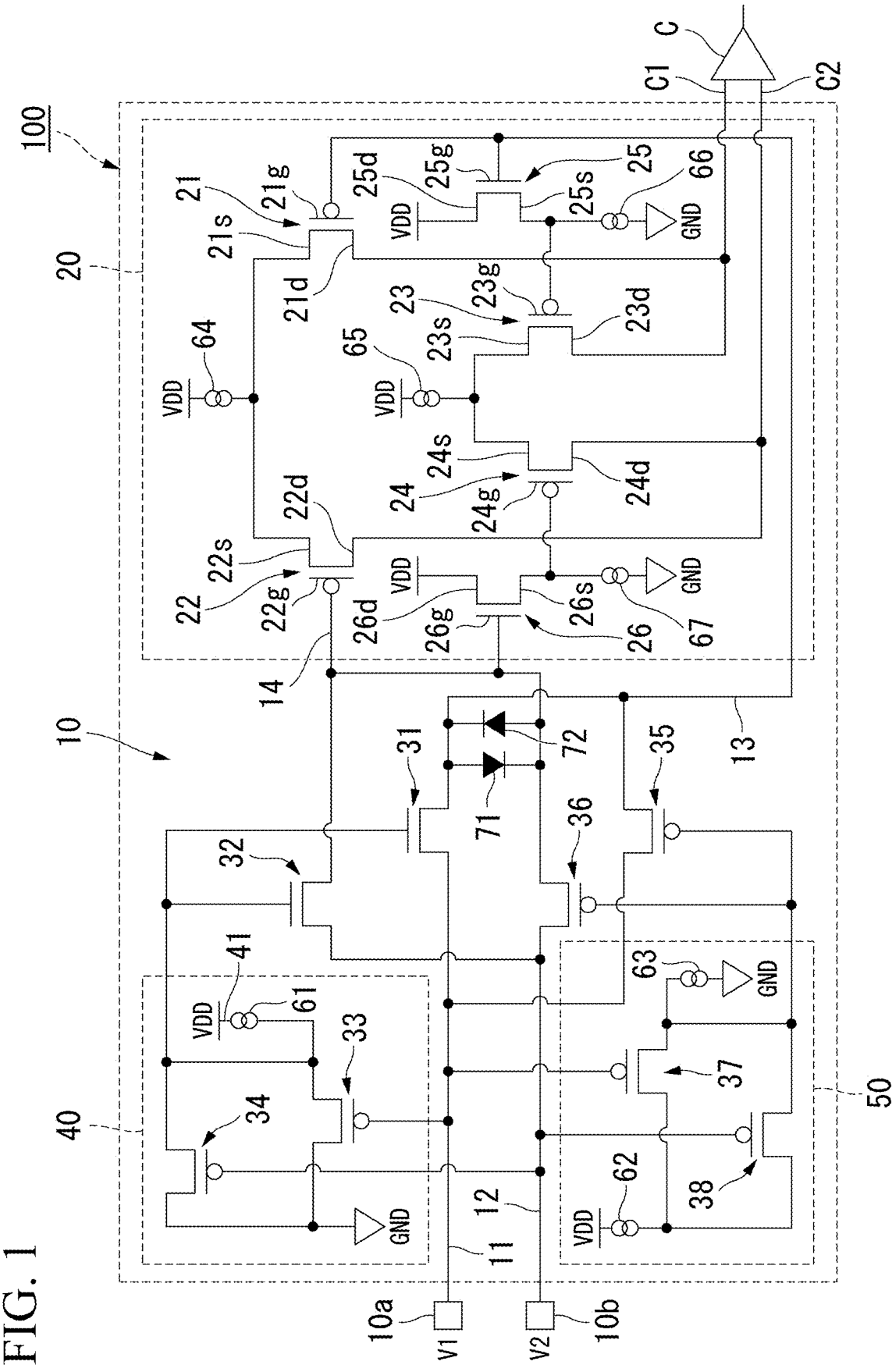
FIG. 1 is a circuit diagram showing a semiconductor device of an embodiment.
Figure 2:
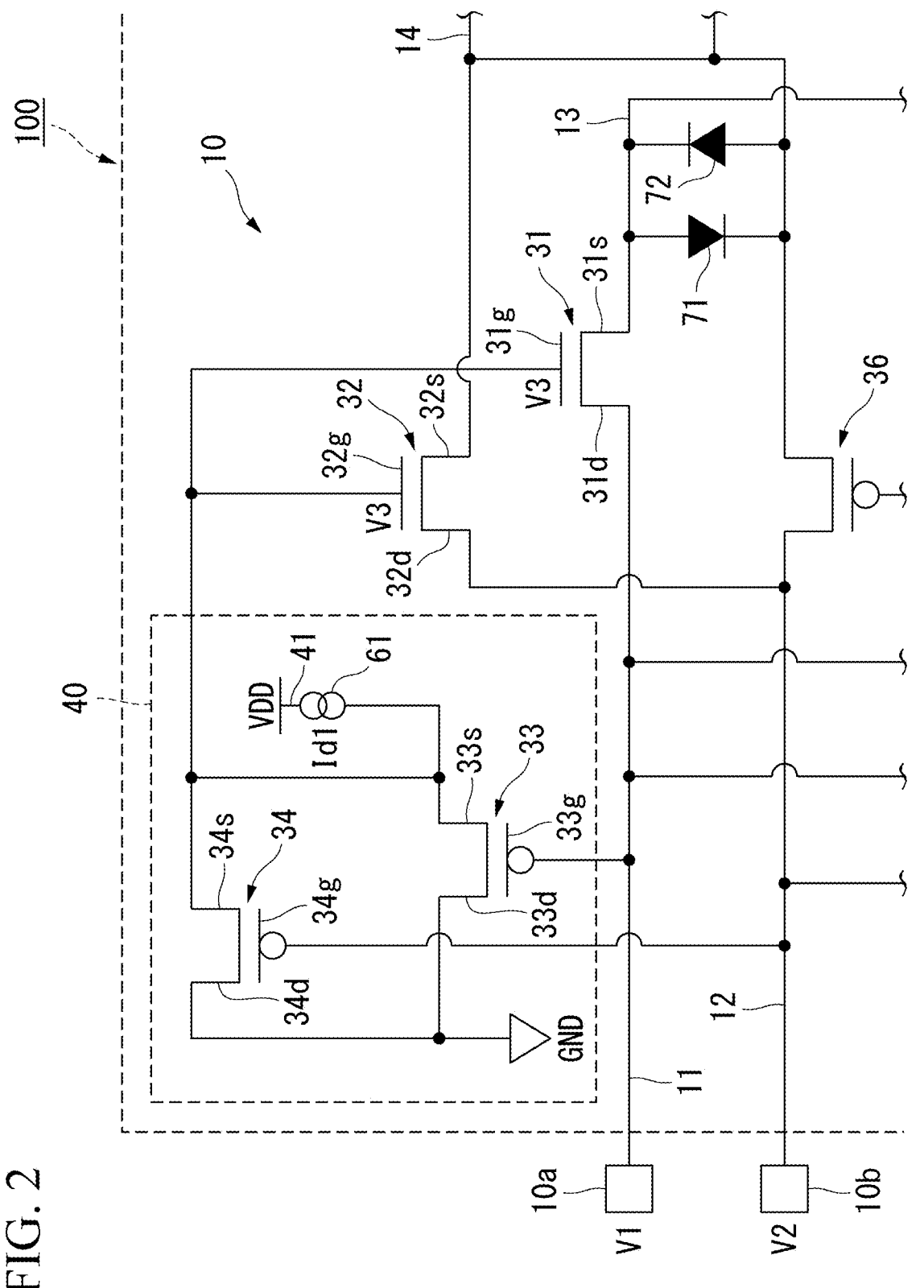
FIG. 2 is a circuit diagram showing a portion of a semiconductor device of an embodiment.
Figure 3:
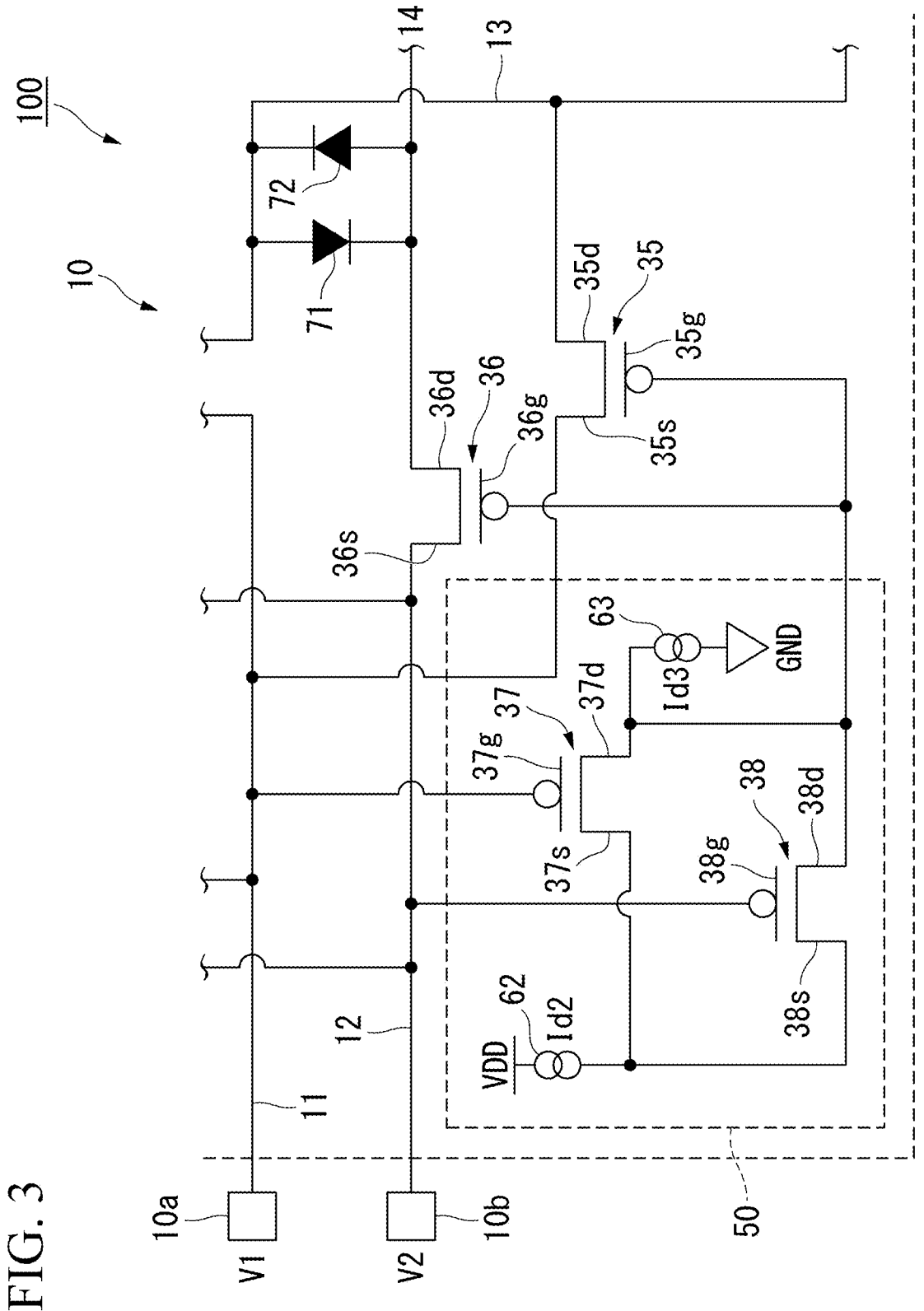
FIG. 3 is a circuit diagram showing another portion of a semiconductor device of an embodiment.
Figure 4:
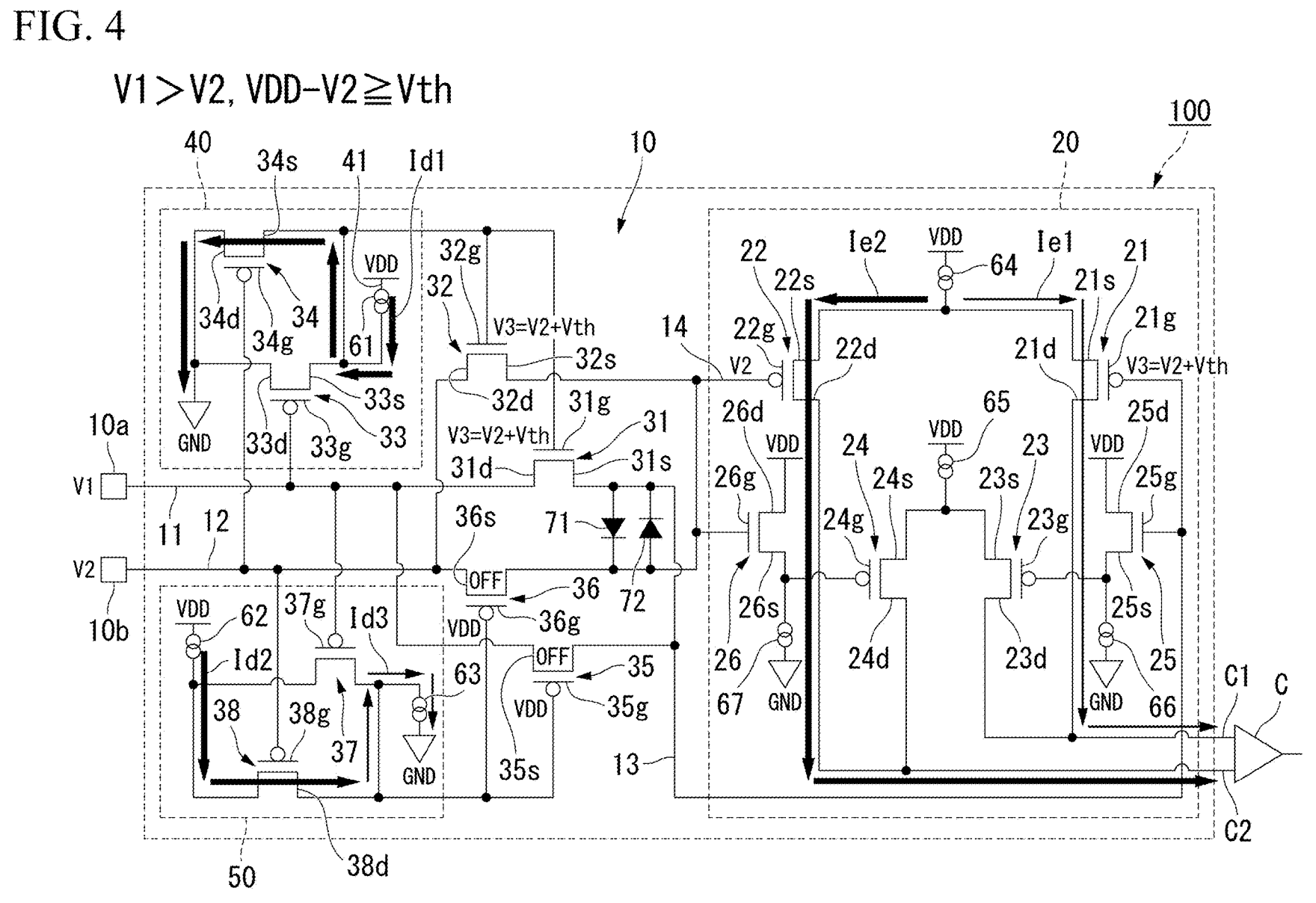
Figure 5:
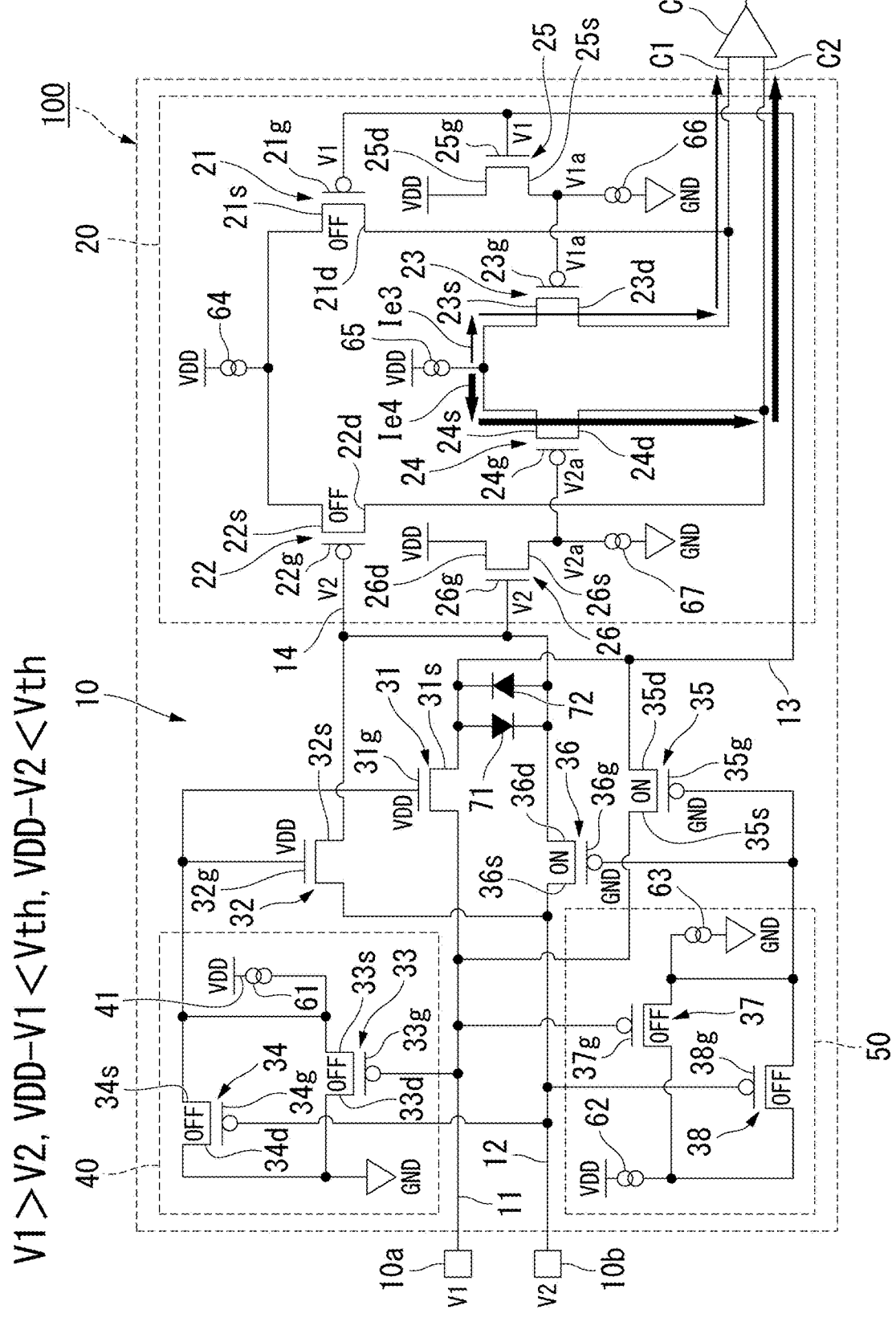
FIG. 5 is a circuit diagram showing another example of the operation of a semiconductor device of an embodiment.

FIG. 1 is a circuit diagram showing a semiconductor device 100 of this embodiment. FIG. 2 is a circuit diagram showing a part of the semiconductor device 100 of this embodiment. FIG. 3 is a circuit diagram showing another part of the semiconductor device 100 of this embodiment. FIG. 4 is a circuit diagram showing an example of the operation of the semiconductor device 100 of this embodiment. FIG. 5 is a circuit diagram showing another example of the operation of the semiconductor device 100 of this embodiment. The semiconductor device 100 shown in FIG. 1 outputs two output values to an output circuit C. The two output values are two voltage values or two current values. The output circuit C is, for example, a comparator. The output circuit C is not particularly limited as long as it is a circuit to which two values are input.

As shown in FIG. 1, the semiconductor device 100 includes an input circuit 10 and a differential circuit 20. The input circuit 10 is a circuit that inputs two different voltages to the differential circuit 20. The differential circuit 20 is a circuit that generates two output values to be output to the output circuit C based on the two voltages input from the input circuit 10.

The input circuit 10 includes a first input terminal 10a, a second input terminal 10b, a first input wiring section 11, a second input wiring section 12, a first output wiring section 13, a second output wiring section 14, a first transistor 31, a second transistor 32, a fifth transistor 35, a sixth transistor 36, a voltage generation circuit section 40, a voltage comparing circuit section 50, a first diode 71, and a second diode 72. The first input terminal 10a and the second input terminal 10b are exposed to the outside of the semiconductor device 100. A first voltage V1 is applied to the first input terminal 10a. A second voltage V2 different from the first voltage V1 is applied to the second input terminal 10b.

The first input wiring section 11 is connected to the first input terminal 10a. The first input wiring section 11 is applied with the first voltage V1 applied to the first input terminal 10a. The second input wiring section 12 is connected to the second input terminal 10b. The second input wiring section 12 is applied with the second voltage V2 applied to the second input terminal 10b.

The first output wiring section 13 and the second output wiring section 14 output different voltages to the differential circuit 20. The first output wiring section 13 outputs a voltage to a first differential transistor 21 (described later) in the differential circuit 20. The second output wiring section 14 outputs a voltage to a first differential transistor 22 (described later) in the differential circuit 20.

The first transistor 31 is disposed between the first input wiring section 11 and the first output wiring section 13. The second transistor 32 is disposed between the second input wiring section 12 and the second output wiring section 14. In this embodiment, the first transistor 31 and the second transistor 32 are field effect transistors (FETs). More specifically, the first transistor 31 and the second transistor 32 are N-channel metal-oxide-semiconductor field-effect transistors (MOSFETs). As shown in FIG. 2, the drain terminal 31$d$ of the first transistor 31 is connected to the first input wiring section 11. The source terminal 31$s$ of the first transistor 31 is connected to the first output wiring section 13. The drain terminal 32$d$ of the second transistor 32 is connected to the second input wiring section 12. The source terminal 32$s$ of the second transistor 32 is connected to the second output wiring section 14. In this embodiment, the absolute value Vth of the threshold voltage of the first transistor 31 and the absolute value Vth of the threshold voltage of the second transistor 32 are the same. The absolute value Vth of the threshold voltage of the first transistor 31 and the absolute value Vth of the threshold voltage of the second transistor 32 may be different from each other.

In the circuit of the present disclosure, the term "threshold voltage" may mean a threshold voltage in the narrow sense, which is a voltage value required to turn a transistor ON, or a threshold voltage in the broader sense, which is the sum of the threshold voltage in the narrow sense and the surplus voltage (overdrive voltage) required to pass current from each current source to the transistor. In other words, the absolute value Vth of the threshold voltage of each transistor in the embodiment may be the absolute value of the voltage required to turn each transistor ON, or the absolute value of the voltage required to turn each transistor ON and pass a current from each current source to each transistor.

In the circuit of the present disclosure, "an element is disposed between a certain element and another element" means that an element is disposed in a circuit between the certain element and another element.

The voltage generation circuit section 40 is a circuit that generates a third voltage V3 based on at least one of the first voltage V1 and the second voltage V2. The third voltage V3 is a voltage at which the difference with the lower of the first voltage V1 and the second voltage V2 is smaller than the difference between the first voltage V1 and the second voltage V2 when the difference between the first voltage V1 and the second voltage V2 is larger than a first predetermined value. In this embodiment, the first predetermined value is the absolute value Vth of the threshold voltages of the third transistor 33 and the fourth transistor, which will be described later. The first predetermined value is not particularly limited. In this embodiment, the voltage generation circuit section 40 generates the third voltage V3 based on the lower of the first voltage V1 and the second voltage V2. The voltage generation circuit section 40 has a third transistor 33, a fourth transistor 34, and a first current source 61.

The first current source 61 is connected to the power supply voltage wiring section 41 to which the power supply voltage VDD is applied. The first current source 61 is configured to pass a constant current Id1. The first current source 61 may have any configuration as long as it can pass a constant current Id1. The magnitude of the current Id1 is not particularly limited.

In this embodiment, the third transistor 33 and the fourth transistor 34 are field effect transistors. More specifically, the third transistor 33 and the fourth transistor 34 are P-channel MOSFETs. The third transistor 33 and the fourth transistor 34 are arranged in parallel between the power supply voltage wiring section 41 to which the power supply voltage VDD is applied and the ground GND. In this embodiment, the third transistor 33 and the fourth transistor 34 are arranged in parallel between the first current source 61 and the ground GND. The ground GND has a reference potential. The reference potential is, for example, 0V. The reference potential is not particularly limited and may be a potential other than 0V. The voltage described in this embodiment is a voltage based on the reference potential of the ground GND. In other words, the voltage of the ground GND is 0V.

The source terminal 33$s$ of the third transistor 33 and the source terminal 34$s$ of the fourth transistor 34 are connected to each other. The source terminal 33$s$ of the third transistor 33 and the source terminal 34$s$ of the fourth transistor 34 are connected to the first current source 61, the gate terminal 31$g$ of the first transistor 31, and the gate terminal 32$g$ of the second transistor 32. The drain terminal 33$d$ of the third transistor 33 and the drain terminal 34$d$ of the fourth transistor 34 are connected to each other. The drain terminal 33$d$ of the third transistor 33 and the drain terminal 34$d$ of the fourth transistor 34 are connected to the ground GND. The gate terminal 33$g$ of the third transistor 33 is connected to the first input wiring section 11. The gate terminal 34$g$ of the fourth transistor 34 is connected to the second input wiring section 12.

In this disclosure, the gate terminal of a field effect transistor corresponds to a "drive terminal". The drive terminal of a transistor is a terminal to which a voltage is applied to drive the transistor. In this embodiment, the source terminal 33$s$ of the third transistor 33 and the source terminal 34$s$ of the fourth transistor 34 correspond to the "first terminal". The drain terminal 33$d$ of the third transistor 33 and the drain terminal 34$d$ of the fourth transistor 34 correspond to the "second terminal".

The third voltage V3 generated in the voltage generation circuit section 40 is applied to the gate terminal 31$g$ of the first transistor 31 and the gate terminal 32$g$ of the second transistor 32. In this embodiment, the value of the third voltage V3 is the value obtained by adding the absolute value Vth of the threshold voltage of the third transistor 33 or the fourth transistor 34 included in the voltage generation circuit section 40 to the value of the lower voltage of the first voltage V1 or the second voltage V2. In this embodiment, the absolute value Vth of the threshold voltage of the third transistor 33 and the absolute value Vth of the threshold voltage of the fourth transistor 34 are the same. In this embodiment, the absolute value Vth of the threshold voltage of the third transistor 33 and the absolute value Vth of the threshold voltage of the fourth transistor 34 are the same as the absolute value Vth of the threshold voltage of the first transistor 31 and the absolute value Vth of the threshold voltage of the second transistor 32. The absolute value Vth of the threshold voltage of the third transistor 33 and the absolute value Vth of the threshold voltage of the fourth transistor 34 may be different from each other.

When a voltage is applied to each of the first input terminal 10$a$ and the second input terminal 10$b$, a first voltage V1 is applied to the gate terminal 33$g$ of the third transistor 33 in the voltage generation circuit section 40, and a second voltage V2 is applied to the gate terminal 34$g$ of the fourth transistor 34. In this embodiment, the third transistor 33 and the fourth transistor 34 are P-channel MOSFETs. Therefore, the third transistor 33 and the fourth transistor 34 are in the ON state if the voltage applied to each gate terminal is lower than the voltage applied to each source terminal by the absolute value Vth of the threshold voltage or more, that is, if the gate voltage that is a negative value is equal to or lower than the threshold voltage. When the third transistor 33 and the fourth transistor 34 are in the OFF state, the current Id1 flowing from the first current source 61 connected to the power supply voltage VDD does not flow to the ground GND, so the voltage of the source terminal 33$s$ of the third transistor 33 and the source terminal 34s of the fourth transistor 34 becomes the power supply voltage VDD. In this case, if the first voltage V1 and the second voltage V2 are lower than the power supply voltage VDD by the absolute value Vth of the threshold voltage of the third transistor 33 and the fourth transistor 34, the third transistor 33 and the fourth transistor 34 are in the ON state.

In addition, when the third transistor 33 and the fourth transistor 34 are in the ON state, the lower the voltage applied to the gate terminal, the easier it is for a current to flow between the source terminal and drain terminal of the third transistor 33 and the fourth transistor 34. Therefore, if the second voltage V2 is lower than the first voltage V1, a current flows more easily between the source terminal 34s and the drain terminal 34d of the fourth transistor 34 than between the source terminal 33s and the drain terminal 33d of the third transistor 33. On the other hand, if the first voltage V1 is lower than the second voltage V2, a current flows more easily between the source terminal 33s and the drain terminal 33d of the third transistor 33 than between the source terminal 34s and the drain terminal 34d of the fourth transistor 34.

FIG. 4 shows a case where the second voltage V2 is lower than the first voltage V1, and the second voltage V2 is lower than the power supply voltage VDD by at least the absolute value Vth of the threshold voltages of the third transistor 33 and the fourth transistor 34. In the example of FIG. 4, the first voltage V1 is higher than the second voltage V2 and is lower than the power supply voltage VDD. In the example of FIG. 4, the difference between the first voltage V1 and the second voltage V2 is greater than the absolute value Vth (first predetermined value) of the threshold voltages of the third transistor 33 and the fourth transistor 34. In FIG. 4, current flows more easily through the fourth transistor 34 than through the third transistor 33, so the current Id1 flowing from the first current source 61 flows more easily to ground GND via the fourth transistor 34. When the current Id1 flows through the fourth transistor 34, the voltage of the source terminal 34s of the fourth transistor 34 drops to a value obtained by adding the absolute value Vth of the threshold voltage of the fourth transistor 34 to the second voltage V2 applied to the gate terminal 34g of the fourth transistor 34. The voltage of the source terminal 34s at this time is the third voltage V3 generated in the voltage generation circuit section 40. That is, the relationship among the second voltage V2, the absolute value Vth of the threshold voltage of the fourth transistor 34, and the third voltage V3 is expressed as V3=V2+Vth. In the example of FIG. 4, the first voltage V1 is higher than the second voltage V2, and the difference between the first voltage V1 and the second voltage V2 is larger than the absolute value Vth, so the third voltage V3 is lower than the first voltage V1. Also, the difference between the second voltage V2, which is lower than the first voltage V1, and the third voltage V3 is the absolute value Vth. In other words, the difference between the second voltage V2 and the third voltage V3 is smaller than the difference between the first voltage V1 and the second voltage V2. The generated third voltage V3 is applied to the gate terminal 31g of the first transistor 31 connected to the source terminal 34s and the gate terminal 32g of the second transistor 32.

Since the source terminal 33s of the third transistor 33 is connected to the source terminal 34s of the fourth transistor 34, the voltage of the source terminal 33s of the third transistor 33 also becomes the third voltage V3. At this time, since the first voltage V1 higher than the second voltage V2 is applied to the gate terminal 33g of the third transistor 33, if the absolute value Vth of the threshold voltage of the third transistor 33 is the same as the absolute value Vth of the threshold voltage of the fourth transistor 34, the third transistor 33 is in the OFF state.

When the first voltage V1 is lower than the second voltage V2, similarly to the above example, the value of the third voltage V3 is the value of the first voltage V1 applied to the gate terminal 33g of the third transistor 33 plus the absolute value Vth of the threshold voltage of the third transistor 33. At this time, if the difference between the first voltage V1 and the second voltage V2 is greater than the absolute value Vth, the third voltage V3 will be lower than the second voltage V2, and the difference between the first voltage V1, which is lower than the second voltage V2, and the third voltage V3 will be the absolute value Vth. In other words, in this case, the difference between the first voltage V1 and the third voltage V3 will be smaller than the difference between the first voltage V1 and the second voltage V2.

As described above, in this embodiment, the third voltage V3 is the sum of the lower of the first voltage V1 and the second voltage V2 and the absolute value Vth of the third transistor 33 and the fourth transistor 34. Therefore, if the difference between the first voltage V1 and the second voltage V2 is greater than the absolute value Vth, the difference between the lower of the first voltage V1 and the second voltage V2 and the third voltage V3 is smaller than the difference between the first voltage V1 and the second voltage V2. In this manner, the voltage generation circuit section 40 generates the third voltage V3.

As shown in FIG. 1, the fifth transistor 35 is disposed between the first input wiring section 11 and the first output wiring section 13. The fifth transistor 35 is connected in parallel with the first transistor 31. The sixth transistor 36 is disposed between the second input wiring section 12 and the second output wiring section 14. The sixth transistor 36 is connected in parallel with the second transistor 32. In this embodiment, the fifth transistor 35 and the sixth transistor 36 are field effect transistors. More specifically, the fifth transistor 35 and the sixth transistor 36 are P-channel MOS-FETs.

As shown in FIG. 3, the source terminal 35s of the fifth transistor 35 is connected to the first input wiring section 11. The drain terminal 35d of the fifth transistor 35 is connected to the first output wiring section 13. The source terminal 36s of the sixth transistor 36 is connected to the second input wiring section 12. The drain terminal 36d of the sixth transistor 36 is connected to the second output wiring section 14.

The voltage comparison circuit section 50 is a circuit that compares the first voltage V1 and the second voltage V2 with the power supply voltage VDD. The voltage comparison circuit section 50 has a seventh transistor 37, an eighth transistor 38, a second current source 62, and a third current source 63. The power supply voltage VDD is applied to the second current source 62. The third current source 63 is connected to the ground GND. The second current source 62 and the third current source 63 are configured to pass a constant current. The current Id3 output by the third current source 63 is smaller than the current Id2 output by the second current source 62. The second current source 62 and the third current source 63 may have any configuration as long as they can pass constant currents Id2 and Id3, respectively. As long as the current Id3 is smaller than the current Id2, the magnitudes of the currents Id2 and Id3 are not particularly limited.

The seventh transistor 37 and the eighth transistor 38 are arranged in parallel with each other between the output side of the second current source 62 and the input side of the third current source 63. In this embodiment, the seventh transistor 37 and the eighth transistor 38 are field effect transistors. More specifically, the seventh transistor 37 and the eighth transistor 38 are P-channel MOSFETs. The source terminal 37s of the seventh transistor 37 and the source terminal 38s of the eighth transistor 38 are connected to each other. The source terminal 37s of the seventh transistor 37 and the source terminal 38s of the eighth transistor 38 are connected to the second current source 62. The drain terminal 37d of the seventh transistor 37 and the drain terminal 38d of the eighth transistor 38 are connected to each other. The drain terminal 37d of the seventh transistor 37 and the drain terminal 38d of the eighth transistor 38 are connected to the third current source 63, the gate terminal 35g of the fifth transistor 35, and the gate terminal 36g of the sixth transistor 36. The gate terminal 37g of the seventh transistor 37 is connected to the first input wiring section 11. The gate terminal 38g of the eighth transistor 38 is connected to the second input wiring section 12. In this embodiment, the absolute value Vth of the threshold voltage of the seventh transistor 37 and the absolute value Vth of the threshold voltage of the eighth transistor 38 are the same, and are same as the absolute value Vth of the threshold voltage of the third transistor 33 and the absolute value Vth of the threshold voltage of the fourth transistor 34.

In this disclosure, of the drain terminal and source terminal of a field effect transistor, the terminal from which current flows out when the field effect transistor is in the ON state corresponds to the "output terminal". That is, in a P-channel type field effect transistor, the drain terminal corresponds to the "output terminal", and in an N-channel type field effect transistor, the source terminal corresponds to the "output terminal".

The voltage comparison circuit section 50 turns the fifth transistor 35 and the sixth transistor 36 to the OFF state when at least one of the difference between the first voltage V1 and the power supply voltage VDD and the difference between the second voltage V2 and the power supply voltage VDD is equal to or greater than a second predetermined value. In this embodiment, the second predetermined value is the absolute value Vth of the threshold voltages of the seventh transistor 37 and the eighth transistor 38. The second predetermined value is not particularly limited and may be a value other than the absolute value Vth. FIG. 4 shows a case where the second voltage V2 is lower than the first voltage V1, and the difference (VDD−V2) of the second voltage V2 with respect to the power supply voltage VDD is equal to or greater than the second predetermined value, that is, the absolute value Vth. In this case, the P-channel eighth transistor 38 is turned on, and the current Id2 output from the second current source 62 flows through the eighth transistor 38 and attempts to flow to the ground GND via the third current source 63. However, the current Id3 output from the third current source 63 to the ground GND is smaller than the current Id2 output from the second current source 62. Therefore, only a part of the current Id2 output from the second current source 62 flows to the ground GND, and charges are accumulated in the drain terminal 38d of the eighth transistor 38. As a result, the voltage of the drain terminal 38d of the eighth transistor 38 becomes the power supply voltage VDD. Therefore, the voltage applied to the gate terminal 35g of the fifth transistor 35 and the gate terminal 36g of the sixth transistor 36 connected to the drain terminal 38d also becomes the power supply voltage VDD. On the other hand, since the first voltage V1 applied to the source terminal 35s of the fifth transistor 35 and the second voltage V2 applied to the source terminal 36s of the sixth transistor 36 are lower than the power supply voltage VDD, the P-channel fifth transistor 35 and the sixth transistor 36 are in the OFF state. The same is true when the first voltage V1 is lower than the second voltage V2 and the difference (VDD−V1) of the first voltage V1 with respect to the power supply voltage VDD is equal to or greater than the second predetermined value, i.e., the absolute value Vth, except that the current Id2 flows through the seventh transistor 37.

The voltage comparison circuit section 50 turns on the fifth transistor 35 and the sixth transistor 36 when both the difference between the first voltage V1 and the power supply voltage VDD and the difference between the second voltage V2 and the power supply voltage VDD are smaller than the second predetermined value, i.e., the absolute value Vth. FIG. 5 shows a case where the second voltage V2 is lower than the first voltage V1, and both the difference between the first voltage V1 and the power supply voltage VDD (VDD−V1) and the difference between the second voltage V2 and the power supply voltage VDD (VDD−V2) are smaller than the second predetermined value (absolute value Vth). In this case, the voltages applied to the gate terminal 37g of the seventh transistor 37 and the gate terminal 38g of the eighth transistor 38 are not lower than the absolute value Vth or more with respect to the power supply voltage VDD, so the P-channel seventh transistor 37 and the eighth transistor 38 are turned off. When both the seventh transistor 37 and the eighth transistor 38 are in the OFF state, the gate terminal 35g of the fifth transistor 35 and the gate terminal 36g of the sixth transistor 36 are shorted to the ground GND via the third current source 63, and the voltages applied to the gate terminal 35g of the fifth transistor 35 and the gate terminal 36g of the sixth transistor 36 become the voltage of the ground GND, i.e., 0 V. On the other hand, since the first voltage V1 applied to the source terminal 35s of the fifth transistor 35 and the second voltage V2 applied to the source terminal 36s of the sixth transistor 36 have values close to the power supply voltage VDD, the P-channel fifth transistor 35 and the sixth transistor 36 are in the ON state. This also applies to the case where the first voltage V1 is lower than the second voltage V2, and both the difference between the first voltage V1 and the power supply voltage VDD (VDD−V1) and the difference between the second voltage V2 and the power supply voltage VDD (VDD−V2) are smaller than the second predetermined value (absolute value Vth).

As shown in FIG. 1, the first diode 71 and the second diode 72 are disposed between the first output wiring section 13 and the second output wiring section 14. The anode of the first diode 71 is connected to the first output wiring section 13. The cathode of the first diode 71 is connected to the second output wiring section 14. The anode of the second diode 72 is connected to the second output wiring section 14. The cathode of the second diode 72 is connected to the first output wiring section 13. The forward voltage of the first diode 71 and the forward voltage of the second diode 72 are, for example, the same as each other. The forward voltage of the first diode 71 and the forward voltage of the second diode 72 may be different from each other.

The differential circuit 20 has a pair of first differential transistors 21, 22 constituting a differential pair, a pair of second differential transistors 23, 24 constituting a differential pair, a pair of auxiliary transistors 25, 26, a fourth current source 64, a fifth current source 65, a sixth current source 66, and a seventh current source 67. The fourth current source 64, the fifth current source 65, the sixth current source 66, and the seventh current source 67 are each configured to pass a constant current. The power supply voltage VDD is applied to the fourth current source 64 and the fifth current source 65. The sixth current source 66 and the seventh current source 67 are connected to the ground GND. The current output from the fourth current source 64 and the current output from the fifth current source 65 are, for example, the same in magnitude. The current output from the sixth current source 66 and the current output from the seventh current source 67 are, for example, the same in magnitude. The current output from the sixth current source 66 and the current output from the seventh current source 67 are, for example, smaller than the current output from the fourth current source 64 and the current output from the fifth current source 65.

In this embodiment, the pair of first differential transistors 21, 22, the pair of second differential transistors 23, 24, and the pair of auxiliary transistors 25, 26 are field effect transistors. More specifically, the pair of first differential transistors 21, 22 and the pair of second differential transistors 23, 24 are P-channel MOSFETs. The pair of auxiliary transistors 25, 26 are N-channel MOSFETs. The absolute values Vth of the threshold voltages of the pair of first differential transistors 21, 22 are the same. The absolute values Vth of the threshold voltages of the pair of second differential transistors 23, 24 are the same. The absolute values Vth of the threshold voltages of the pair of auxiliary transistors 25, 26 are the same. The absolute value Vth of the threshold voltage of the pair of first differential transistors 21, 22, the absolute value Vth of the threshold voltage of the pair of second differential transistors 23, 24, and the absolute value Vth of the threshold voltage of the pair of auxiliary transistors 25, 26 are, for example, the same as the absolute value Vth of the threshold voltage of the third transistor 33 and the absolute value Vth of the threshold voltage of the fourth transistor 34.

The pair of first differential transistors 21, 22 are arranged in parallel with each other between the fourth current source 64 connected to the power supply voltage VDD and the output circuit C. The source terminal 21s of the first differential transistor 21 and the source terminal 22s of the first differential transistor 22 are connected to each other. The source terminal 21s of the first differential transistor 21 and the source terminal 22s of the first differential transistor 22 are connected to the fourth current source 64. The drain terminal 21d of the first differential transistor 21 is connected to the terminal C1 in the output circuit C. The drain terminal 22d of the first differential transistor 22 is connected to the terminal C2 in the output circuit C. The gate terminal 21g of the first differential transistor 21 is connected to the first output wiring section 13. As a result, a voltage is output from the first output wiring section 13 to the first differential transistor 21. The gate terminal 22g of the first differential transistor 22 is connected to the second output wiring section 14. As a result, a voltage is output from the second output wiring section 14 to the first differential transistor 22.

The pair of second differential transistors 23, 24 are arranged in parallel with each other between the fifth current source 65 connected to the power supply voltage VDD and the output circuit C. The source terminal 23s of the second differential transistor 23 and the source terminal 24s of the second differential transistor 24 are connected to each other. The source terminal 23s of the second differential transistor 23 and the source terminal 24s of the second differential transistor 24 are connected to the fifth current source 65. The drain terminal 23d of the second differential transistor 23 is connected to the terminal C1 in the output circuit C. The drain terminal 24d of the second differential transistor 24 is connected to the terminal C2 in the output circuit C.

The gate terminal 25g of the auxiliary transistor 25 is connected to the first output wiring section 13. The power supply voltage VDD is applied to the drain terminal 25d of the auxiliary transistor 25. The source terminal 25s of the auxiliary transistor 25 is connected to the sixth current source 66 and the gate terminal 23g of the second differential transistor 23.

The gate terminal 26g of the auxiliary transistor 26 is connected to the second output wiring section 14. The power supply voltage VDD is applied to the drain terminal 26d of the auxiliary transistor 26. The source terminal 26s of the auxiliary transistor 26 is connected to the seventh current source 67 and the gate terminal 24g of the second differential transistor 24.

The operation of the semiconductor device 100 will now be described. First, a case where at least one of the difference between the first voltage V1 and the power supply voltage VDD and the difference between the second voltage V2 and the power supply voltage VDD is equal to or greater than the second predetermined value (absolute value Vth) will be described. In the following description, the case shown in FIG. 4, that is, the case where the second voltage V2 is lower than the first voltage V1, will be described as an example. When at least one of the difference between the first voltage V1 and the power supply voltage VDD and the difference between the second voltage V2 and the power supply voltage VDD is equal to or greater than the second predetermined value (absolute value Vth), as described above, the voltage comparison circuit section 50 turns the fifth transistor 35 and the sixth transistor 36 to the OFF state. Therefore, no current flows through the fifth transistor 35 and the sixth transistor 36.

On the other hand, the voltage generation circuit section 40 generates the third voltage V3 and applies the third voltage V3 to the gate terminal 31g of the first transistor 31 and the gate terminal 32g of the second transistor 32. If the voltage of the source terminal 31s of the first transistor 31 is lower than the third voltage V3 by the threshold voltage or more, the first transistor 31 is turned on and a current flows from the drain terminal 31d to the source terminal 31s of the first transistor 31. When a current flows through the first transistor 31, the voltage of the source terminal 31s tries to rise toward the first voltage V1 applied to the drain terminal 31d, but since only the third voltage V3 obtained by adding the absolute value Vth of the threshold voltage to the second voltage V2 is applied to the gate terminal 31g, as the voltage of the source terminal 31s rises, it becomes difficult for a current to flow through the first transistor 31. As a result, the voltage of the source terminal 31s can only rise to the third voltage V3 applied to the gate terminal 31g, and as a result, it becomes the third voltage V3. As a result, the voltage of the first output wiring section 13 connected to the source terminal 31s of the first transistor 31 becomes the third voltage V3, and the third voltage V3 is applied to the gate terminal 21g of the first differential transistor 21 connected to the first output wiring section 13.

In the second transistor 32, the second voltage V2 is applied to the drain terminal 32d, and the third voltage V3 is applied to the gate terminal 32g. Therefore, even if a current flows through the second transistor 32 and the voltage of the source terminal 32s rises to the second voltage V2, the gate voltage becomes equal to or higher than the threshold voltage, and the second transistor 32 remains in the ON state. Therefore, the voltage of the source terminal 32s becomes the second voltage V2, and the voltage of the second output wiring section 14 connected to the source terminal 32s of the second transistor 32 becomes the second voltage V2. As a result, the second voltage V2 is applied to the gate terminal 22g of the first differential transistor 22 connected to the source terminal 32s of the second transistor 32.

When the third voltage V3 is applied to the gate terminal 21g of the first differential transistor 21 and the second voltage V2 is applied to the gate terminal 22g of the first differential transistor 22, the current output from the fourth current source 64 is divided and flows through the first differential transistor 21 and the first differential transistor 22. At this time, the magnitude of the current flowing through each of the first differential transistors 21 and 22 is determined by the magnitude of the voltage applied to the gate terminal of each of the first differential transistors 21 and 22. In this embodiment, since the first differential transistors 21 and 22 are P-channel MOSFETs, the lower the voltage applied to the gate terminal, the easier it is for a current to flow. Therefore, in the example of FIG. 4, the current Ie2 flowing through the first differential transistor 22 to which the second voltage V2 lower than the third voltage V3 is applied is larger than the current Ie1 flowing through the first differential transistor 21. The current Ie1 is output to the terminal C1 of the output circuit C, and the current Ie2 is output to the terminal C2 of the output circuit C. As a result, two different currents are output from the semiconductor device 100 to the output circuit C. For example, a resistor or the like may be disposed between each of the pair of first differential transistors 21, 22 and the output circuit C so two different voltages are output to the output circuit C.

Next, a case in which both the difference between the first voltage V1 and the power supply voltage VDD and the difference between the second voltage V2 and the power supply voltage VDD are smaller than the above-mentioned second predetermined value (absolute value Vth) will be described. In the following description, the case shown in FIG. 5, that is, the case in which the second voltage V2 is lower than the first voltage V1, will be described as an example. When both the difference between the first voltage V1 and the power supply voltage VDD and the difference between the second voltage V2 and the power supply voltage VDD are smaller than the second predetermined value, both the first voltage V1 and the second voltage V2 are close to the power supply voltage VDD. Therefore, the gate voltages of the third transistor 33 and the fourth transistor 34 in the voltage generation circuit section 40 cannot be lowered below the threshold voltage, and the third transistor 33 and the fourth transistor 34 are in the OFF state. In this case, the voltages of the source terminal 33s of the third transistor 33 and the source terminal 34s of the fourth transistor 34 become the power supply voltage VDD, and the voltages applied to the gate terminal 31g of the first transistor 31 and the gate terminal 32g of the second transistor 32 also become the power supply voltage VDD. Therefore, the voltage generation circuit section 40 cannot generate the above-mentioned third voltage V3.

On the other hand, as described above, when both the difference between the first voltage V1 and the power supply voltage VDD and the difference between the second voltage V2 and the power supply voltage VDD are smaller than the second predetermined value (absolute value Vth), the voltage comparing circuit section 50 turns the fifth transistor 35 and the sixth transistor 36 in the ON state. As a result, the voltage of the drain terminal 35d of the fifth transistor 35 becomes the first voltage V1, which is the same as the voltage of the source terminal 35s, and the voltage of the drain terminal 36d of the sixth transistor 36 becomes the second voltage V2, which is the same as the voltage of the source terminal 36s. As a result, the first voltage V1 is applied to the gate terminal 21g of the first differential transistor 21, and the second voltage V2 is applied to the gate terminal 22g of the first differential transistor 22.

In this case, the difference between the first voltage V1 and the power supply voltage, and the difference between the second voltage V2 and the power supply voltage VDD, are lower than the absolute value Vth of the threshold voltage of the first differential transistors 21, 22. Therefore, even if the first voltage V1 and the second voltage V2 are applied to the first differential transistors 21, 22, respectively, the first differential transistors 21, 22 remain in the OFF state. Meanwhile, in this case, the first voltage V1 is also applied to the gate terminal 25g of the auxiliary transistor 25, and the second voltage V2 is also applied to the gate terminal 26g of the auxiliary transistor 26. As a result, the auxiliary transistors 25, 26 are turned ON, and a current output to ground GND by the sixth current source 66 or the seventh current source 67 flows from the drain terminal to the source terminal of the auxiliary transistors 25, 26. As a result, the voltages of the source terminals 25s and 26s of the auxiliary transistors 25 and 26 rise, but the voltages of the source terminals 25s and 26s are the minimum voltage values that can keep the auxiliary transistors 25 and 26 in the ON state. In other words, the voltages of the source terminals 25s and 26s are lower than the voltages applied to the gate terminals 25g and 26g by the absolute value Vth of the threshold voltages of the auxiliary transistors 25 and 26. Therefore, the voltage of the source terminal 25s of the auxiliary transistor 25 is a voltage V1a that is lower than the first voltage V1 by the absolute value Vth of the threshold voltage of the auxiliary transistor 25. The voltage of the source terminal 26s of the auxiliary transistor 26 is a voltage V2a that is lower than the second voltage V2 by the absolute value Vth of the threshold voltage of the auxiliary transistor 26. As a result, the voltage V1a is applied to the gate terminal 23g of the second differential transistor 23, and the voltage V2a is applied to the gate terminal 24g of the second differential transistor 24.

Since each of the voltages V1a, V2a is lower than the power supply voltage VDD by the absolute value of the threshold voltage of the pair of second differential transistors 23, 24 or more, the pair of second differential transistors 23, 24 are both in the ON state. As a result, a current from the fifth current source 65 flows through each of the pair of second differential transistors 23, 24 at a rate based on the magnitude of the voltage applied to each of the gate terminals 23g, 24g. In the example of FIG. 5, since the voltage V2a is lower than the voltage V1a, the second differential transistor 24 is more likely to pass a current than the second differential transistor 23. As a result, the current Ie4 flowing through the second differential transistor 24 is larger than the current Ie3 flowing through the second differential transistor 23. The current Ie3 is output to the terminal C1 of the output circuit C, and the current Ie4 is output to the terminal C2 of the output circuit C. As a result, two different currents are output from the semiconductor device 100 to the output circuit C. In this case, for example, a resistor element or the like may be disposed between each of the pair of second differential transistors 23, 24 and the output circuit C, so two different voltages are input to the output circuit C.

When both the difference between the first voltage V1 and the power supply voltage VDD and the difference between the second voltage V2 and the power supply voltage VDD are equal to or greater than the second predetermined value (absolute value Vth) described above, and the difference between the first voltage V1 and the second voltage V2 is equal to or less than the first predetermined value (absolute value Vth), the third voltage V3 is generated as described above, but the third voltage V3 is equal to or greater than the higher of the first voltage V1 and the second voltage V2. In other words, the third voltage V3 is equal to or greater than the first voltage V1 and the second voltage V2. In this case, both the first transistor 31 and the second transistor 32 are in the ON state, the first voltage V1 is applied to the gate terminal 21g of the first differential transistor 21, and the second voltage V2 is applied to the gate terminal 22g of the first differential transistor 22.

For example, when the difference between the voltages applied to the gate terminals of the pair of first differential transistors 21 and 22 is large, a large amount of current flows through one of the first differential transistors having a lower voltage applied to its gate terminal, resulting in a lower voltage at the source terminal of the one first differential transistor. In this case, the voltage at the source terminal of the other first differential transistor connected to the source terminal of the one first differential transistor also becomes lower. On the other hand, since a higher voltage is applied to the gate terminal of the other first differential transistor than to the gate terminal of the one first differential transistor, the voltage difference between the source terminal and gate terminal of the other first differential transistor becomes large. If this state is maintained, the first differential transistor deteriorates, causing a problem of the BTI phenomenon in which the threshold voltage of the first differential transistor fluctuates.

In contrast, according to this embodiment, the input circuit 10, which inputs a voltage to each of the gate terminals 21g, 22g (drive terminals) of the pair of first differential transistors 21, 22 that constitute a differential pair, includes a first input wiring section 11 to which a first voltage V1 is applied, a second input wiring section 12 to which a second voltage V2 different from the first voltage V1 is applied, a first output wiring section 13 that outputs a voltage to one of the pair of first differential transistors 21, 22, a second output wiring section 14 that outputs a voltage to the other of the pair of first differential transistors 21, 22, a voltage generation circuit section 40 that generates a third voltage V3 based on at least one of the first voltage V1 and the second voltage V2, a first transistor 31 arranged between the first input wiring section 11 and the first output wiring section 13, and a second transistor 32 arranged between the second input wiring section 12 and the second output wiring section 14. A third voltage V3 is applied to a gate terminal 31g (drive terminal) of the first transistor 31 and a gate terminal 32g (drive terminal) of the second transistor 32. When the difference between the first voltage V1 and the second voltage V2 is larger than the absolute value Vth (first predetermined value) of the threshold voltages of the third transistor 33 and the fourth transistor 34, the difference between the lower of the first voltage V1 and the second voltage V2 and the third voltage V3 is smaller than the difference between the first voltage V1 and the second voltage V2. When the difference between the first voltage V1 and the second voltage V2 is larger than the absolute value Vth of the threshold voltages of the third transistor 33 and the fourth transistor 34, as described above, the lower of the first voltage V1 and the second voltage V2 is applied directly to one of the pair of first differential transistors 21, 22 via one of the first transistor 31 and the second transistor 32, and the higher of the first voltage V1 and the second voltage V2 is converted to the third voltage V3 via the other of the first transistor 31 and the second transistor 32 and applied to the other of the pair of first differential transistors 21, 22. In this case, since the difference between the lower of the first voltage V1 and the second voltage V2 and the third voltage V3 is smaller than the difference between the first voltage V1 and the second voltage V2, the third voltage V3 becomes lower than the higher of the first voltage V1 and the second voltage V2. This makes it possible to reduce the voltage difference applied to the gate terminals 21g, 22g of the pair of first differential transistors 21, 22. Therefore, even if the voltage continues to be applied to the gate terminals 21g, 22g of the pair of first differential transistors 21, 22 when the difference between the first voltage V1 and the second voltage V2 is greater than the absolute value Vth, which is the first predetermined value, the occurrence of the BTI phenomenon can be suppressed. In addition, when the higher voltage of the first voltage V1 and the second voltage V2 is converted to the third voltage V3 through the other of the first transistor 31 and the second transistor 32, the other transistor is almost in the OFF state, so the impedance of the other transistor is very large. As a result, almost no current flows through the other transistor, and even if it does flow, it is an extremely small current. As described above, according to this embodiment, it is possible to suppress the occurrence of the BTI phenomenon while suppressing the current from flowing between the first input terminal 10a and the second input terminal 10b.

Also, for example, it is possible to use a separately prepared internal voltage for the second voltage V2, rather than the voltage input from the second input terminal 10b, and to convert the first voltage V1 to a voltage lower than the first voltage V1 using this internal voltage and a transistor. However, in this case, it is necessary to separately prepare an internal voltage lower than the first voltage V1, and there is a problem that only one voltage equal to or higher than the internal voltage can be input to the input circuit. In other words, there is a problem that the voltage range that can be used as the input to the input circuit is equal to or higher than the internal voltage. In contrast, in this embodiment, the voltage generation circuit section 40 can generate the third voltage V3 based on at least one of the first voltage V1 and the second voltage V2. Therefore, it is possible to generate a third voltage V3 of an appropriate magnitude according to the magnitude of at least one of the input first voltage V1 and the second voltage V2, without separately preparing an internal voltage. As a result, the voltage input to the input circuit 10 can be limited to two, the first voltage V1 and the second voltage V2, input from the first input terminal 10a and the second input terminal 10b, and the voltage range that can be input to the input circuit 10 can be set to the ground GND voltage, i.e., 0V or higher.

Furthermore, according to this embodiment, the voltage generation circuit section 40 generates the third voltage V3 based on the lower voltage of the first voltage V1 and the second voltage V2. Therefore, compared to the case where the third voltage V3 is generated based on the higher voltage of the first voltage V1 and the second voltage V2, the third voltage V3 can be made closer to the lower voltage of the first voltage V1 and the second voltage V2. This makes it possible to further reduce the difference in voltage applied to the gate terminals 21g, 22g of the pair of first differential transistors 21, 22. Therefore, the occurrence of the BTI phenomenon can be further suppressed.

Furthermore, according to this embodiment, the first predetermined value is the absolute value Vth of the threshold voltage of the third transistor 33 and the fourth transistor 34 included in the voltage generation circuit section 40. The value of the third voltage V3 is the lower voltage value of the first voltage V1 and the second voltage V2 plus the absolute value Vth of the threshold voltage of the third transistor 33 and the fourth transistor 34 included in the voltage generation circuit section 40. Therefore, the difference between the second voltage V2 and the third voltage V3 can be suitably reduced, and the difference in voltages applied to the gate terminals 21g, 22g of the pair of first differential transistors 21, 22 can be more suitably reduced. This makes it possible to more suitably suppress the occurrence of the BTI phenomenon.

Furthermore, according to this embodiment, the voltage generation circuit section 40 has a third transistor 33 having a gate terminal 33g (drive terminal) connected to the first input wiring section 11, and a fourth transistor 34 having a gate terminal 34g (drive terminal) connected to the second input wiring section 12. The source terminal 33s (first terminal) of the third transistor 33 and the source terminal 34s (first terminal) of the fourth transistor 34 are connected to each other and are also connected to the gate terminal 31g (drive terminal) of the first transistor 31 and the gate terminal 32g (drive terminal) of the second transistor 32. The drain terminal 33d (second terminal) of the third transistor 33 and the drain terminal 34d (second terminal) of the fourth transistor 34 are connected to each other. Therefore, the degree of ON/OFF of each transistor can be changed according to the magnitude relationship between the first voltage V1 applied to the gate terminal 33g of the third transistor 33 and the second voltage V2 applied to the gate terminal 34g of the fourth transistor 34. As a result, as described above, the third voltage V3 can be generated as the voltage of the source terminal of each transistor, and the third voltage V3 can be applied to the gate terminal 31g of the first transistor 31 and the gate terminal 32g of the second transistor 32.

Furthermore, according to this embodiment, the voltage generation circuit section 40 has a first current source 61 connected to the source terminal 33s (first terminal) of the third transistor 33 and the source terminal 34s (first terminal) of the fourth transistor 34. The third transistor 33 and the fourth transistor 34 are arranged in parallel between the power supply voltage wiring section 41 to which the power supply voltage VDD is applied and ground GND. The first current source 61 is connected to the power supply voltage wiring section 41. Therefore, as described above, the ease of current flow between the third transistor 33 and the fourth transistor 34 changes depending on the magnitude relationship between the first voltage V1 and the second voltage V2, and the third voltage V3 can be generated based on the voltage applied to the gate terminal of the transistor through which the current Id1 from the first current source 61 flows more easily. In this embodiment, since the third transistor 33 and the fourth transistor 34 are P-channel type field effect transistors, the current Id1 output from the first current source 61 flows more easily through the transistor to which the lower of the first voltage V1 and the second voltage V2 is applied, and a third voltage V3 that is higher than the lower of the first voltage V1 and the second voltage V2 by the absolute value Vth of the threshold voltage can be generated.

Furthermore, according to this embodiment, the input circuit 10 includes a voltage comparison circuit section 50 that compares the first voltage V1 and the second voltage V2 with the power supply voltage VDD, a fifth transistor 35 that is arranged between the first input wiring section 11 and the first output wiring section 13 and connected in parallel to the first transistor 31, and a sixth transistor 36 that is arranged between the second input wiring section 12 and the second output wiring section 14 and connected in parallel to the second transistor 32. The voltage comparison circuit section 50 turns the fifth transistor 35 and the sixth transistor 36 to the OFF state when at least one of the difference between the first voltage V1 and the power supply voltage VDD and the difference between the second voltage V2 and the power supply voltage VDD is equal to or greater than the absolute value Vth (second predetermined value) of the threshold voltage, and turns the fifth transistor 35 and the sixth transistor 36 to the ON state when both the difference between the first voltage V1 and the power supply voltage VDD and the difference between the second voltage V2 and the power supply voltage VDD are smaller than the absolute value Vth. Therefore, as described above, when both the first voltage V1 and the second voltage V2 are close to the power supply voltage VDD and the third voltage V3 is not generated well in the voltage generation circuit section 40, the fifth transistor 35 and the sixth transistor 36 are turned to the ON state, and the first voltage V1 and the second voltage V2 can be applied as they are to the gate terminals 21g and 22g of the pair of first differential transistors 21 and 22, respectively. This allows different voltages to be applied to the pair of first differential transistors 21 and 22 even when the third voltage V3 is not generated properly. In this case, the difference between the first voltage V1 and the second voltage V2 is small because both the first voltage V1 and the second voltage V2 are close to the power supply voltage VDD. Therefore, even if the first voltage V1 and the second voltage V2 are continuously applied to the gate terminals 21g and 22g of the pair of first differential transistors 21 and 22, the occurrence of the BTI phenomenon can be suppressed.

Furthermore, if both the difference between the first voltage V1 and the power supply voltage VDD and the difference between the second voltage V2 and the power supply voltage VDD are equal to or greater than the second predetermined value (absolute value Vth) described above, and the difference between the first voltage V1 and the second voltage V2 is equal to or less than the first predetermined value (absolute value Vth), then the first voltage V1 and the second voltage V2 are applied as is to the gate terminals 21g and 22g of the pair of first differential transistors 21 and 22, as described above. However, even in this case, since the difference between the first voltage V1 and the second voltage V2 is equal to or less than the first predetermined value (absolute value Vth), the occurrence of the BTI phenomenon can be suppressed even if the state in which the first voltage V1 and the second voltage V2 are applied as is to the gate terminals 21g and 22g of the pair of first differential transistors 21 and 22 continues.

As described above, in this embodiment, even if the first voltage V1 and the second voltage V2 input to the input circuit 10 are any value within the range of 0V or more and the power supply voltage VDD or less, it is possible to input two voltages based on the first voltage V1 and the second voltage V2 to the differential circuit 20 while suppressing the occurrence of the BTI phenomenon.

Furthermore, according to this embodiment, the voltage comparison circuit section 50 has a seventh transistor 37 having a gate terminal 37g (drive terminal) connected to the first input wiring section 11, an eighth transistor 38 having a gate terminal 38g (drive terminal) connected to the second input wiring section 12, a second current source 62 to which the power supply voltage VDD is applied, and a third current source 63 connected to ground GND. The seventh transistor 37 and the eighth transistor 38 are arranged in parallel with each other between the output side of the second current source 62 and the input side of the third current source 63. The drain terminal 37d (output terminal) of the seventh transistor 37 and the drain terminal 38d (output terminal) of the eighth transistor 38 are connected to each other and are also connected to the third current source 63, the gate terminal 35g (drive terminal) of the fifth transistor 35, and the gate terminal 36g (drive terminal) of the sixth transistor 36. The current Id3 output by the third current source 63 is smaller than the current Id2 output by the second current source 62. Therefore, when at least one of the seventh transistor 37 and the eighth transistor 38 is in the ON state, the current Id2 flowing from the second current source 62 cannot be completely flowed to the ground GND, and the voltage of the drain terminal 37d of the seventh transistor 37 and the voltage of the drain terminal 38d of the eighth transistor 38 become the power supply voltage VDD. On the other hand, when both the seventh transistor 37 and the eighth transistor 38 are in the OFF state, the voltages at the drain terminal 37d of the seventh transistor 37 and the drain terminal 38d of the eighth transistor 38 become the reference potential of the ground GND, that is, 0V. Therefore, the states of the seventh transistor 37 and the eighth transistor 38 are switched depending on the magnitudes of the first voltage V1 and the second voltage V2 relative to the power supply voltage VDD, so the voltages applied to the gate terminal 35g of the fifth transistor 35 and the gate terminal 36g of the sixth transistor 36 can be switched between the power supply voltage VDD and 0V. Therefore, the states of the fifth transistor 35 and the sixth transistor 36 can be suitably switched.

Furthermore, according to this embodiment, the input circuit 10 includes a first diode 71 having an anode connected to the first output wiring section 13 and a cathode connected to the second output wiring section 14, and a second diode 72 having an anode connected to the second output wiring section 14 and a cathode connected to the first output wiring section 13. Therefore, even if an unintended charge is applied to the output wiring section connected to the first transistor 31 or the second transistor 32 that is in a substantially OFF state, the charge can be discharged via the first diode 71 or the second diode 72.

Figure 6:
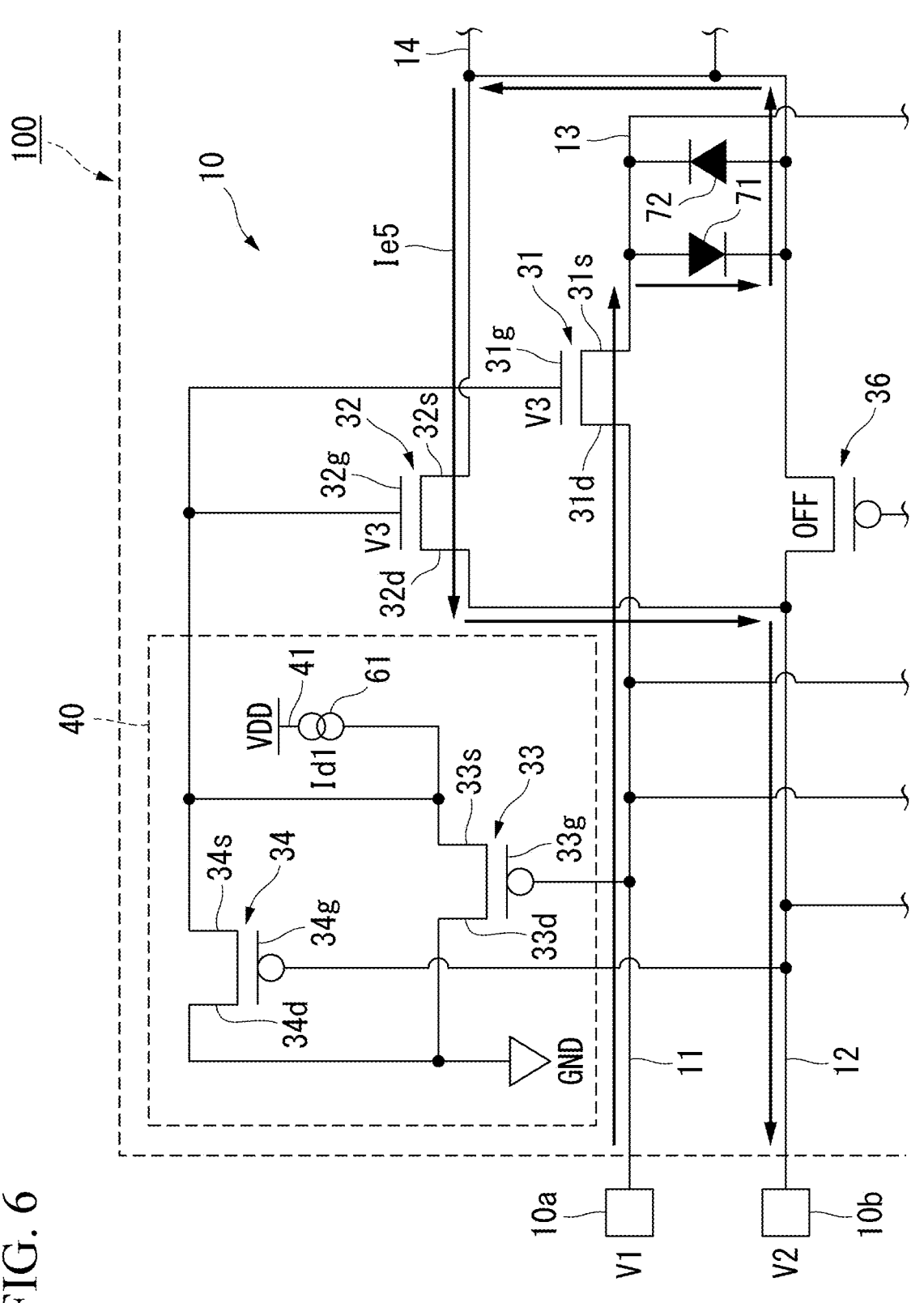
FIG. 6 is a circuit diagram showing the current that flows when charge is released by a first diode of an embodiment.

FIG. 6 is a circuit diagram showing the current Ie5 that flows when the charge is released by the first diode 71. FIG. 6 shows a case where the first voltage V1 is higher than the second voltage V2 and the first transistor 31 is in a substantially OFF state. In this case, the voltage of the first output wiring section 13 connected to the source terminal 31s of the first transistor 31 becomes the third voltage V3 as described above. In this case, if the first diode 71 does not exist, even if a charge is applied to the first output wiring section 13 for some reason, there is no place for the charge to escape, and the voltage of the first output wiring section 13 may become higher than the third voltage V3. By contrast, according to this embodiment, the first diode 71 is provided so that when the voltage of the first output wiring section 13 rises, the current Ie5 can flow to release the charge. The current Ie5 flows from the first input terminal 10a through the first input wiring section 11, the first transistor 31, the first output wiring section 13, the first diode 71, the second output wiring section 14, the second transistor 32, and the second input wiring section 12 in this order, and then flows to the second input terminal 10b. Even in this case, the impedance of the first transistor 31 is sufficiently large, so the magnitude of the current Ie5 that flows can be suitably reduced.

Figure 7:
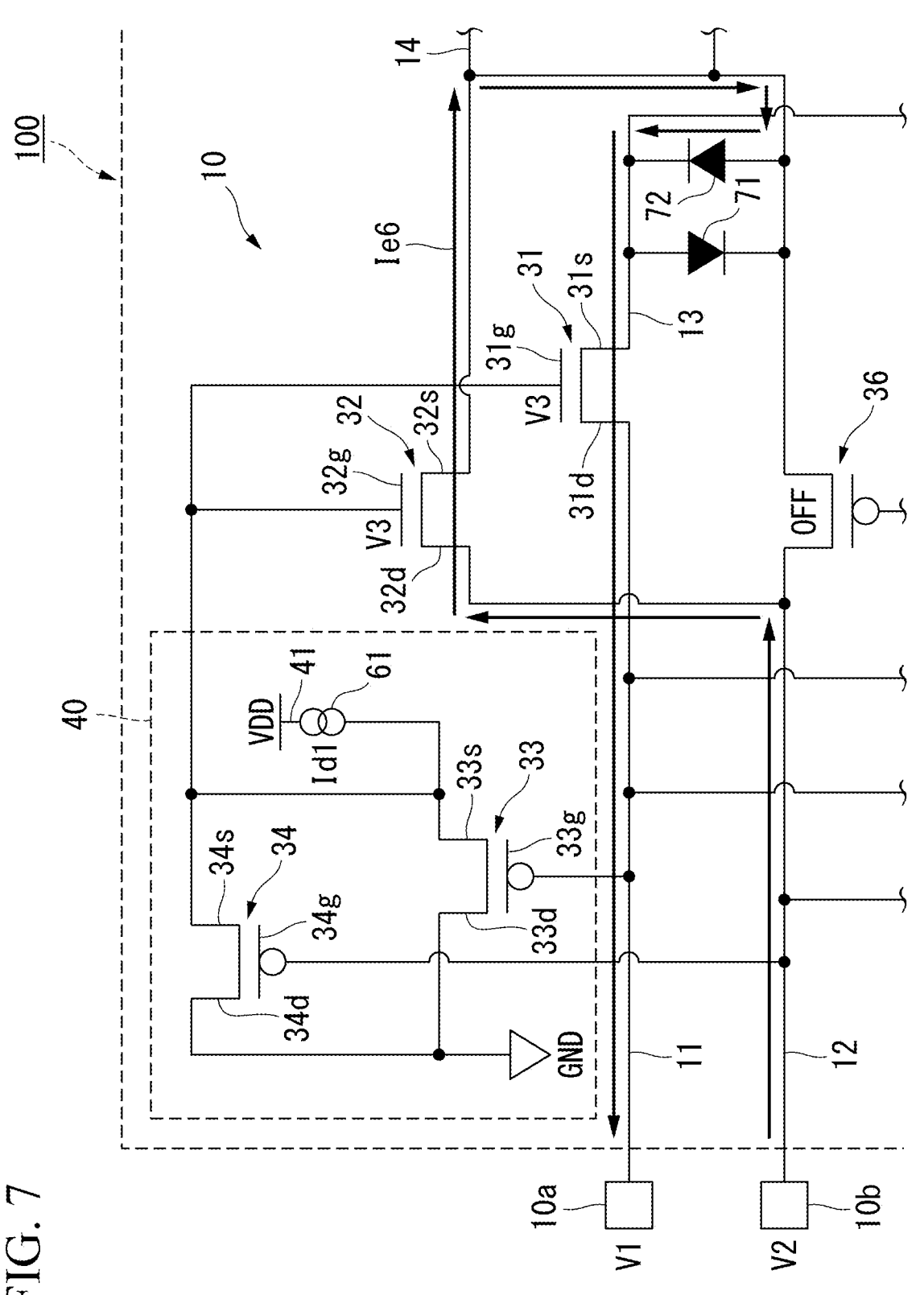
FIG. 7 is a circuit diagram showing the current that flows when charge is released by a second diode of an embodiment.

FIG. 7 is a circuit diagram showing the current Ie6 that flows when the second diode 72 releases the charge. FIG. 7 shows a case where the second voltage V2 is higher than the first voltage V1 and the second transistor 32 is almost in the OFF state. In this case, by providing the second diode 72, when the voltage of the second output wiring section 14 rises, the current Ie6 can be made to flow and the charge can be released. The current Ie6 flows from the second input terminal 10b through the second input wiring section 12, the second transistor 32, the second output wiring section 14, the second diode 72, the first output wiring section 13, the first transistor 31, and the first input wiring section 11 in this order, and then flows to the first input terminal 10a. Even in this case, the impedance of the second transistor 32 is sufficiently large, so the magnitude of the current Ie6 that flows can be suitably reduced.

According to at least one embodiment described above, the input circuit is an input circuit that inputs a voltage to each of the drive terminals of a pair of differential transistors that form a differential pair. The input circuit has a first input wiring section to which a first voltage is applied, a second input wiring section to which a second voltage different from the first voltage is applied, a first output wiring section to output a voltage to one of a pair of differential transistors, a second output wiring section to output a voltage to the other of the pair of differential transistors, a voltage generation circuit section to generate a third voltage based on at least one of the first voltage and the second voltage, a first transistor disposed between the first input wiring section and the first output wiring section, and a second transistor disposed between the second input wiring section and the second output wiring section. The third voltage is applied to the drive terminal of the first transistor and the drive terminal of the second transistor. When the difference between the first voltage and the second voltage is greater than a first predetermined value, the difference between the lower of the first voltage and the second voltage and the third voltage is smaller than the difference between the first voltage and the second voltage. This makes it possible to suppress the occurrence of the BTI phenomenon while suppressing the flow of current between the input terminals.

In the above embodiment, the absolute values of the threshold voltages of the transistors are the same, but this is not limiting. The multiple transistors in the above embodiment may include transistors whose absolute values of threshold voltages are different from each other. The voltage generation circuit section may be a circuit of any configuration as long as it generates the third voltage based on at least one of the first voltage and the second voltage. The voltage generation circuit section may be a circuit that generates the third voltage based on the higher voltage of the first voltage and the second voltage, or a circuit that generates the third voltage based on both the first voltage and the second voltage. The third voltage generated by the voltage generation circuit section may be a voltage of any value as long as the difference between the lower voltage of the first voltage and the second voltage is smaller than the difference between the first voltage and the second voltage when the difference between the first voltage and the second voltage is greater than the first predetermined value.

The first current source in the voltage generation circuit section may be connected to ground. In this case, for example, the third voltage may be generated based on the higher of the first and second voltages, and the value of the third voltage may be the higher voltage minus the absolute value of the threshold voltage of the third or fourth transistor. Even in this case, the difference between the two voltages applied to the pair of differential transistors is smaller than the difference between the first and second voltages, and the occurrence of the BTI phenomenon can be suppressed. In this case, the third and fourth transistors are, for example, N-channel transistors.

The voltage comparison circuit section may have any circuit configuration as long as it turns the fifth and sixth transistors OFF when at least one of the difference between the first voltage and the power supply voltage and the difference between the second voltage and the power supply voltage is equal to or greater than the second predetermined value, and turns the fifth and sixth transistors ON when both the difference between the first voltage and the power supply voltage and the difference between the second voltage and the power supply voltage are smaller than the second predetermined value.

Each of the transistors in the above-described embodiments, including the first to eighth transistors, may be any type of transistor. Each of the transistors may be an N-channel type field effect transistor or a P-channel type field effect transistor. At least one of the transistors may be a bipolar transistor.

The input circuit and the semiconductor device of the embodiments include the following additional aspects.

APPENDIX 1

An input circuit that inputs a voltage to each of the drive terminals of a pair of differential transistors constituting a differential pair, including:

a first input wiring section to which a first voltage is applied;

a second input wiring section to which a second voltage different from the first voltage is applied;

a first output wiring section to which a voltage is output to one of the pair of differential transistors;

a second output wiring section to which a voltage is output to the other of the pair of differential transistors;

a voltage generation circuit section to generate a third voltage based on at least one of the first voltage and the second voltage;

a first transistor disposed between the first input wiring section and the first output wiring section; and a second transistor disposed between the second input wiring section and the second output wiring section, wherein the third voltage is applied to the drive terminal of the first transistor and the drive terminal of the second transistor, and when the difference between the first voltage and the second voltage is greater than a first predetermined value, the difference between the lower of the first voltage and the second voltage and the third voltage is less than the difference between the first voltage and the second voltage.

APPENDIX 2

The input circuit according to appendix 1, wherein the voltage generation circuit section generates the third voltage based on the lower of the first voltage and the second voltage.

APPENDIX 3

The input circuit according to appendix 2, wherein the first predetermined value is the absolute value of a threshold voltage of a transistor included in the voltage generation circuit section, and the value of the third voltage is the value of the lower of the first voltage and the second voltage plus the absolute value of the threshold voltage of a transistor included in the voltage generation circuit section.

APPENDIX 4

The input circuit according to any one of appendixes 1 to 3, wherein the voltage generation circuit section includes a third transistor having a drive terminal connected to the first input wiring section, and a fourth transistor having a drive terminal connected to the second input wiring section, the first terminal of the third transistor and the first terminal of the fourth transistor being connected to each other and connected to the drive terminal of the first transistor, and the drive terminal of the second transistor, and the second terminal of the third transistor and the second terminal of the fourth transistor being connected to each other.

APPENDIX 5

The input circuit described in appendix 4, wherein the voltage generation circuit section has a first current source connected to the first terminal of the third transistor and the first terminal of the fourth transistor, the third transistor and the fourth transistor are arranged in parallel with each other between a power supply voltage wiring section to which a power supply voltage is applied and ground, and the first current source is connected to the power supply voltage wiring section or the ground.

APPENDIX 6

The input circuit according to appendix 5, further including:
a voltage comparison circuit section that compares the first voltage and the second voltage with the power supply voltage;
a fifth transistor that is arranged between the first input wiring section and the first output wiring section and connected in parallel with the first transistor; and
a sixth transistor that is arranged between the second input wiring section and the second output wiring section and connected in parallel with the second transistor, wherein the voltage comparison circuit section turns the fifth transistor and the sixth transistor to an OFF state when at least one of the difference between the first voltage and the power supply voltage and the difference between the second voltage and the power supply voltage is equal to or greater than a second predetermined value, and turns the fifth transistor and the sixth transistor to an ON state when both the difference between the first voltage and the power supply voltage and the difference between the second voltage and the power supply voltage are smaller than the second predetermined value.

APPENDIX 7

The input circuit according to appendix 6, wherein the voltage comparison circuit section includes a seventh transistor having a drive terminal connected to the first input wiring section, an eighth transistor having a drive terminal connected to the second input wiring section, a second current source to which the power supply voltage is applied, and a third current source connected to the ground, wherein the seventh transistor and the eighth transistor are arranged in parallel with each other between the output side of the second current source and the input side of the third current source, the output terminal of the seventh transistor and the output terminal of the eighth transistor are connected to each other and to the third current source, the drive terminal of the fifth transistor, and the drive terminal of the sixth transistor, and the current output by the third current source is smaller than the current output by the second current source.

APPENDIX 8

The input circuit according to any one of appendices 1 to 7, further including:

a first diode having an anode connected to the first output wiring section and a cathode connected to the second output wiring section; and a second diode having an anode connected to the second output wiring section and a cathode connected to the first output wiring section.

APPENDIX 9

A semiconductor device, including:

an input circuit according to any one of appendices 1 to 8; and a differential circuit having the pair of differential transistors.

Although several embodiments of the present invention have been described, these embodiments are presented as examples and are not intended to limit the scope of the invention. These embodiments can be implemented in various other forms, and various omissions, substitutions, and modifications can be made without departing from the gist of the invention. These embodiments and their modifications are included within the scope of the invention and its equivalents as well as the scope and gist of the invention.

What is claimed is:

1. An input circuit that inputs a voltage to each of drive terminals of a pair of differential transistors constituting a differential pair, the input circuit comprising:

a first input wiring section to which a first voltage is applied;

a second input wiring section to which a second voltage different from the first voltage is applied;

a first output wiring section from which a voltage is output to one of the pair of differential transistors;

a second output wiring section from which a voltage is output to the other of the pair of differential transistors;

a voltage generation circuit section that generates a third voltage based on at least one of the first voltage and the second voltage;

a first transistor disposed between the first input wiring section and the first output wiring section; and a second transistor disposed between the second input wiring section and the second output wiring section, wherein the third voltage is applied to the drive terminal of the first transistor and the drive terminal of the second transistor, and when a difference between the first voltage and the second voltage is greater than a first predetermined value, a difference between the third voltage and a lower of the first voltage and the second voltage is less than a difference between the first voltage and the second voltage.

2. The input circuit according to claim 1, wherein the voltage generation circuit section generates the third voltage based on the lower of the first voltage and the second voltage.

3. The input circuit according to claim 2, wherein the first predetermined value is an absolute value of a threshold voltage of a transistor included in the voltage generation circuit section, and a value of the third voltage is a value obtained by adding the absolute value of the threshold voltage of the transistor included in the voltage generation circuit section to a value of the lower of the first voltage and the second voltage.

4. The input circuit according to claim 1, wherein the voltage generation circuit section includes a third transistor having a drive terminal connected to the first input wiring section, and a fourth transistor having a drive terminal connected to the second input wiring section, a first terminal of the third transistor and a first terminal of the fourth transistor are connected to each other and connected to the drive terminal of the first transistor and the drive terminal of the second transistor, and a second terminal of the third transistor and a second terminal of the fourth transistor are connected to each other.

5. The input circuit according to claim 4, wherein the voltage generation circuit section has a first current source connected to the first terminal of the third transistor and the first terminal of the fourth transistor, the third transistor and the fourth transistor are arranged in parallel between ground and a power supply voltage wiring section to which a power supply voltage is applied, and the first current source is arranged between the first terminal of the third transistor and the first terminal of the fourth transistor and the power supply voltage wiring section.

6. The input circuit according to claim 5, further comprising:

a voltage comparison circuit section that compares the first voltage and the second voltage with the power supply voltage;

a fifth transistor that is arranged between the first input wiring section and the first output wiring section and is connected in parallel with the first transistor; and a sixth transistor that is arranged between the second input wiring section and the second output wiring section and is connected in parallel with the second transistor, wherein the voltage comparison circuit section turns the fifth transistor and the sixth transistor to an OFF state when at least one of a difference between the first voltage and the power supply voltage and a difference between the second voltage and the power supply voltage is equal to or greater than a second predetermined value, and turns the fifth transistor and the sixth transistor to an ON state when both the difference between the first voltage and the power supply voltage and the difference between the second voltage and the power supply voltage are smaller than the second predetermined value.

7. The input circuit according to claim 6, wherein the voltage comparison circuit section includes a seventh transistor having a drive terminal connected to the first input wiring section, an eighth transistor having a drive terminal connected to the second input wiring section, a second current source to which the power supply voltage is applied, and a third current source connected to the ground, wherein the seventh transistor and the eighth transistor are arranged in parallel with each other between an output side of the second current source and an input side of the third current source, an output terminal of the seventh transistor and an output terminal of the eighth transistor are connected to each other and connected to the third current source, a drive terminal of the fifth transistor, and a drive terminal of the sixth transistor, and a current output by the third current source is smaller than a current output by the second current source.

8. The input circuit according to claim 1, further comprising:

a first diode having an anode connected to the first output wiring section and a cathode connected to the second output wiring section; and a second diode having an anode connected to the second output wiring section and a cathode connected to the first output wiring section.

9. A semiconductor device, comprising:

an input circuit that inputs a voltage to each of drive terminals of a pair of differential transistors constituting a differential pair; and a differential circuit having the pair of differential transistors, wherein the input circuit includes:

a first input wiring section to which a first voltage is applied;

a second input wiring section to which a second voltage different from the first voltage is applied;

a first output wiring section that outputs a voltage to one of the pair of differential transistors;

a second output wiring section that outputs a voltage to the other of the pair of differential transistors;

a voltage generation circuit section that generates a third voltage based on at least one of the first voltage and the second voltage;

a first transistor that is arranged between the first input wiring section and the first output wiring section; and a second transistor that is arranged between the second input wiring section and the second output wiring section, wherein the third voltage is applied to a drive terminal of the first transistor and a drive terminal of the second transistor, and when a difference between the first voltage and the second voltage is greater than a first predetermined value, a difference between the third voltage and a lower of the first voltage and the second voltage is smaller than a difference between the first voltage and the second voltage.

\* \* \* \* \*